US00RE49483E

(19) United States
(12) Reissued Patent
Scheffers

(10) Patent Number: US RE49,483 E
(45) Date of Reissued Patent: Apr. 4, 2023

(54) METHOD FOR DETERMINING A BEAMLET POSITION AND METHOD FOR DETERMINING A DISTANCE BETWEEN TWO BEAMLETS IN A MULTI-BEAMLET EXPOSURE APPARATUS

(71) Applicant: ASML Netherlands B.V., Veldhoven (NL)

(72) Inventor: Paul IJmert Scheffers, Delft (NL)

(73) Assignee: ASML Netherlands B.V., Veldhoven (NL)

(21) Appl. No.: 16/414,386

(22) Filed: May 16, 2019

Related U.S. Patent Documents

Reissue of:
(64) Patent No.: 9,653,259
Issued: May 16, 2017
Appl. No.: 14/400,815
PCT Filed: May 14, 2013
PCT No.: PCT/EP2013/059861
§ 371 (c)(1),
(2) Date: Nov. 13, 2014
PCT Pub. No.: WO2013/171177
PCT Pub. Date: Nov. 21, 2013

U.S. Applications:
(60) Provisional application No. 61/646,430, filed on May 14, 2012.

(51) Int. Cl.
*H01J 37/00* (2006.01)
*H01J 37/304* (2006.01)
(Continued)

(52) U.S. Cl.
CPC ..... *H01J 37/3045* (2013.01); *B82Y 10/00* (2013.01); *B82Y 40/00* (2013.01); *G01B 11/14* (2013.01);
(Continued)

(58) Field of Classification Search
CPC ..... H01J 37/3045; H01J 37/3177; H01J 37/3174; H01J 2237/24514;
(Continued)

(56) References Cited

U.S. PATENT DOCUMENTS 6,353,231 B1 3/2002 Golladay et al.
6,958,804 B2 * 10/2005 Wieland ..... B82Y 10/00 355/53
(Continued)

FOREIGN PATENT DOCUMENTS

EP 1335249 A1 8/2003
JP 54068149 6/1979
(Continued)

*Primary Examiner* — Henry N Tran
(74) *Attorney, Agent, or Firm* — Finnegan, Henderson, Farabow, Garrett & Dunner, LLP

(57) ABSTRACT

The invention relates to a method for determining a beamlet position in a charged particle multi-beamlet exposure apparatus. The apparatus is provided with a sensor comprising a conversion clement for converting charged particle energy into light and a light sensitive detector. The conversion element is provided with a sensor surface area provided with a 2D-pattern of beamlet blocking and non-blocking regions. The method comprises taking a plurality of measurements and determining the position of the beamlet with respect to the 2D-pattern on the basis of a 2D-image created by means of the measurements. Each measurement comprises exposing a feature onto a portion of the 2D-pattern with a beamlet, wherein the feature position differs for each measurement, receiving light transmitted through the non-blocking regions, converting the received light into a light intensity value, and assigning the light intensity value to the position at which the measurement was taken.

20 Claims, 4 Drawing Sheets

(51) Int. Cl.

| | |
|---|---|
| ***B82Y 10/00*** | (2011.01) |
| ***H01J 37/317*** | (2006.01) |
| ***B82Y 40/00*** | (2011.01) |
| ***G01B 11/14*** | (2006.01) |

(52) U.S. Cl.
CPC ..... *H01J 37/3174* (2013.01); *H01J 37/3177* (2013.01); *H01J 2237/065* (2013.01); *H01J 2237/24578* (2013.01); *H01J 2237/3175* (2013.01); *H01J 2237/31774* (2013.01)

(58) Field of Classification Search
CPC ... H01J 2237/24578; H01J 2237/31774; H01J 2237/065; H01J 2237/3175; B82Y 10/00; B82Y 40/00; G01B 11/14
USPC ..... 250/250, 251, 281–300, 302–303, 304, 250/305, 306–443.1, 315.3, 316.1–326, 250/396 R–396 ML, 423 R–423 F, 250/428–432 PD, 453.11–455.11, 489, 250/491.1, 492.1–492.3, 493.1–504 H, 250/505.1–519.1, 522.1, 526
See application file for complete search history.

(56) References Cited

U.S. PATENT DOCUMENTS

| | | | | |
|---|---|---|---|---|
| 7,423,274 | B2 * | 9/2008 | Nakayama | B82Y 10/00 250/492.21 |
| 7,868,300 | B2 * | 1/2011 | Kruit | B82Y 40/00 250/397 |
| 9,030,675 | B2 * | 5/2015 | Meijer | B82Y 10/00 250/311 |
| 2006/0197453 | A1 * | 9/2006 | Nakayama | B82Y 10/00 315/32 |
| 2007/0057204 | A1 * | 3/2007 | Kruit | B82Y 10/00 250/492.23 |
| 2011/0253900 | A1 * | 10/2011 | Hanfoug | B82Y 10/00 250/369 |
| 2012/0293810 | A1 * | 11/2012 | Meijer | B82Y 10/00 356/623 |

FOREIGN PATENT DOCUMENTS

| | | | | |
|---|---|---|---|---|
| JP | 55070024 | | 5/1980 | |
| JP | 01227087 | | 9/1989 | |
| JP | 2004 111422 | | 4/2004 | |
| JP | 2005 032508 | | 2/2005 | |
| JP | 2005 347054 | | 12/2005 | |
| NL | EP 1335249 | A1 * | 8/2003 | G03F 9/7053 |
| NL | WO 2012062931 | A1 * | 5/2012 | B82Y 10/00 |
| WO | WO 2007 032670 | | 3/2007 | |
| WO | WO 2012/062931 | A1 * | 5/2012 | H01J 37/22 |
| WO | WO 2012 062931 | A1 | 5/2012 | |
| WO | WO 2012062931 | A1 | 5/2012 | |

* cited by examiner

METHOD FOR DETERMINING A BEAMLET POSITION AND METHOD FOR DETERMINING A DISTANCE BETWEEN TWO BEAMLETS IN A MULTI-BEAMLET EXPOSURE APPARATUS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*CROSS-REFERENCE TO RELATED APPLICATION*

*This is a reissue of U.S. Pat. No. 9,653,259, issued on May 16, 2017, from U.S. patent application Ser. No. 14/400,815, filed Nov. 13, 2014; which is a National Stage Entry of PCT/EP2013/059861, filed May 14, 2013; which claims the benefit of priority from U.S. Patent Application No. 61/646,430, filed May 14, 2012. The contents of the above-identified applications are incorporated herein by reference in their entireties.*

BACKGROUND OF THE INVENTION

1. Field of the Invention

The present invention relates to a method for determining a beamlet position in a charged particle multi-beamlet exposure apparatus. The present invention further relates to a method for determining a distance between two beamlets in a charged particle multi-beamlet exposure apparatus. Finally, the present invention relates to a computer readable medium for performing, when executed by a processor, one of the abovementioned methods.

2. Description of the Related Art

In order to transfer a pattern onto the target surface, the controllable blocking of beamlets in combination with their movement over the target surface is performed in accordance with modulation information. An example of a multiple charged-particle beamlet lithography system is described in U.S. Pat. No. 6,958,804, which disclosure is herewith incorporated by reference in its entirety.

Such lithography systems can have very large numbers of beamlets, i.e. in the order of 10,000 or higher, for example 13,000. Future designs even envisage numbers in the order of 1,000,000 beamlets. It is a general aim for current electron beam lithography systems to be able to pattern a target surface in high-resolution, with some applications being capable of imaging patterns with a critical dimension of well below 100 nm feature sizes.

For such multiple beamlet, high-resolution lithography systems to be commercially viable they need to meet low error margins. Therefore it is important that the position of each one of the charged particle beamlets is precisely known and controlled. Due to various circumstances, such as manufacturing tolerances and thermal drift, such positions may however deviate from their expected and desired positions, which may render these deviating beamlets invalid for accurate patterning.

In conventional lithography systems, the position of each beamlet is determined by frequent measurement of the beamlet position. With knowledge of the beamlet position the beamlet can be shifted to the correct position.

Known beamlet position calibration methods generally comprise at least three steps: a measuring step in which the position of the beamlet is measured, a calculating step in which the measured position of the beamlet is compared to the desired expected position of that beamlet, and a compensation step in which the difference between the measured position and the desired position is compensated for. Compensation may be performed either in the software or in the hardware of the lithography system.

It is desirable to determine beamlet position during operation of a lithography system to allow for early position calibration to improve the target surface patterning accuracy. In order to limit negative effects on throughput, i.e. the number of target surfaces that can be patterned within a predetermined period of time, it is desirable that the method of measuring the position of the charged particle beamlets can be carried out within a limited period of time without sacrificing accuracy.

In particular, in view of the continuously increasing demands of the industry regarding small dimensions without loss of throughput, there is a need to provide more accurate devices and/or techniques for measurement of beamlet properties in lithography systems, particularly in lithography machines comprising a large number of charged-particle beamlets that are designed to offer a high throughput. A higher accuracy is advantageous for increasing the resolution of a lithography machine.

In particular it is favourable when using stitching, a technique where two beams write on the same area of the wafer, for example to correct for writing failures. The beam separation needs to be known with nanometer precision for this technique.

Furthermore, there is a need to be aware of the absolute position of the beamlets. In particular, such knowledge of absolute position is favorable to improve the accuracy of overlay, i.e. a measure of the alignment accuracy of successive layers or features provided by multiple processes within the same layer with respect to a previously exposed or otherwise patterned layer.

US-patent application 2007/0057204 describes a method for determining the position of charged particle beams. In this method, the position of each charged particle beam within a plurality of charged particle beams is measured by using a converter for converting a charged particle beam into a light beam, and a photon receptor. Optionally, a blocking element is provided to the surface of the converter.

International application WO2012/062931 describes a method for determining a distance between two beamlets in a multi-beamlet exposure apparatus. In this method, a converter is used provided with a sensor surface area provided with a two-dimensional pattern of beamlet blocking and non-blocking regions.

In the techniques used in abovementioned patent documents is based on analysis of the light output related to an impinging charged particle beamlet. If scanning is performed, the light output change as a result of moving the charged particle beamlet from a blocking region towards a non-blocking region, or vice versa, is analyzed.

Although very useful for many applications, the accuracy of this technique depends on the spot size of the beamlet as compared to the dimensions of the blocking feature and/or blocking/non-blocking pattern on the converter surface, i.e. the feature size. If the spot size is much smaller than the feature size, finding the correct position of a beamlet is time-consuming. On the other hand, if the spot size of the beamlet is large compared to the feature size, the position is difficult to find because it will be difficult to fit the measurement results.

BRIEF SUMMARY OF THE INVENTION

An object of the present invention relates to improving the accuracy of a beam separation measurement between two beamlets in a multi-beamlet exposure apparatus, such as a lithography system. For this purpose, the present invention provides a method for determining a distance between two charged particle beamlets in a multi-beamlet exposure apparatus provided with a sensor comprising a conversion element for converting the energy of charged particles into light and a light sensitive detector, the conversion element being provided with a sensor surface area provided with a two-dimensional pattern of beamlet blocking and non-blocking regions, the method comprising: taking a plurality of measurements, wherein each measurement comprises: exposing a feature onto a portion of the two-dimensional pattern with a charged particle beamlet, wherein the position at which the feature is exposed differs for each measurement, the positions forming a two-dimensional grid; receiving light generated by the conversion element in response to charged particles being part of the exposed feature transmitted through the non-blocking regions of two-dimensional pattern; and converting the received light into a light intensity value by means of the light sensitive detector, and assigning the light intensity value to the position at which the measurement was taken; determining the position of the charged particle beamlet with respect to the two-dimensional pattern on the basis of a two-dimensional image created by means of the light intensity values at the different positions within the two-dimensional grid. Exposing a feature onto a portion of the two-dimensional pattern instead of using the spot size of the charged particle beamlet opens the possibility to design the optimal feature for the measurement and/or the two-dimensional pattern at hand. This greatly improves measurement flexibility while maintaining, and in some cases even improving, the measuring accuracy.

BRIEF DESCRIPTION OF THE DRAWINGS

The features and advantages of the invention will be appreciated upon reference to the following drawings, in which:

FIG. 2b represents a graph showing the transmitted intensity as a function of position for the blocking structure of FIG. 2a;

DESCRIPTION OF ILLUSTRATIVE EMBODIMENTS

The following is a description of certain embodiments of the invention, given by way of example only and with reference to the drawings.

Figure 1:
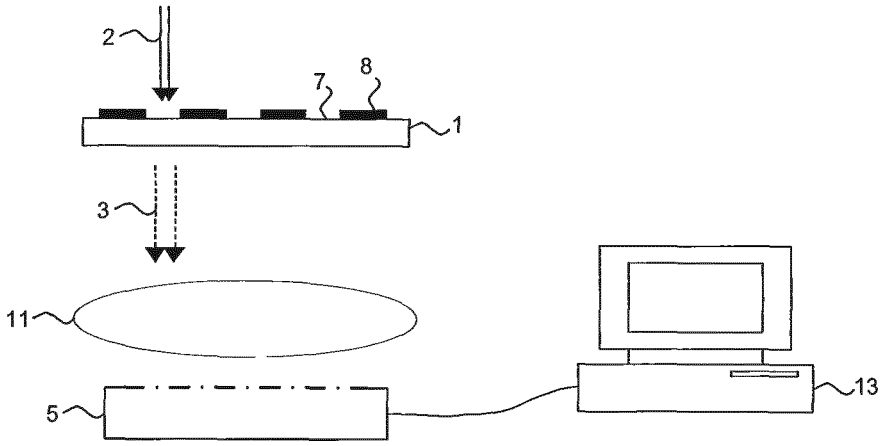
FIG. 1 schematically shows the concept of a sensor using a conversion element.

FIG. 1 schematically shows the operation of a sensor for determining a beamlet position of one or more charged particle beamlets in a charged particle multi-beamlet exposure apparatus. The sensor comprises a conversion element 1 and a light receptor 5. The conversion element 1 is provided with a pattern comprising charged particle blocking regions 8 and charged particle transmissive regions 7, further referred to as non-blocking regions. The conversion element 1 is arranged for receiving charged particles 2 and generating photons in response, further referred to as light 3. The light 3 may be directed towards the photon receptor 5 by means of one or more optical elements 11. The photon receptor 5 is communicatively coupled to a calculation unit, e.g. a computer 13. In case the one or more charged particle beamlets impinge on the conversion element 1 one or more light spots are formed with a pattern corresponding to the pattern of charged particle beamlets. The light spots are then detected with the photon receptor 5, optionally via the optical system 11, and the calculation unit may then determine the beam position of the one or more charged particle beamlets.

The conversion element 1 may take the form of a fluorescent element, for example a fluorescent screen, or a scintillating element, for example a substrate of a doped yttrium aluminum garnet (YAG) material. Hereafter, embodiments of the invention will be described with a YAG-screen being used as conversion element 1, where the YAG-screen may be referred to as YAG 1.

The light receptor 5 may include any suitable light sensitive detector, such as a plurality of diodes, a charged coupled device (CCD) camera or a complementary metal-oxide semiconductor (CMOS) camera. Hereafter, the photon receptor 5 may be referred to as camera 5. Additionally, although embodiments of the invention may be used with respect to other types of charged particles, hereafter, embodiments of the invention will be discussed with reference to electrons.

In electron beamlet devices where the beamlet size is in the nanometer range, for example electron microscopes, electron beam lithography apparatuses, and electron beam pattern generators, direct observation of light created by conversion by the conversion element 1 is insufficient to enable determination of characteristics such as position of an electron beamlet as the resolution is limited by the wavelength of the conversion element 1. To improve accuracy, an electron beamlet may be scanned across an electron blocking structure provided with sharp edges, further referred to as knife edges. An example of a sensor using a conversion element provided with a knife edge is described in patent application US 2007/057204, hereby incorporated by reference in its entirety.

Figure 2A:
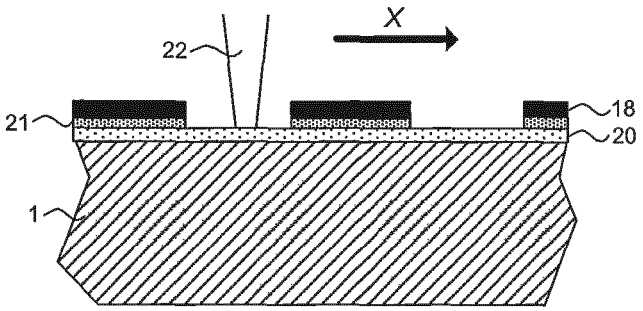
FIG. 2a schematically shows a cross-section of a conversion element provided with a blocking structure.

FIG. 2a schematically shows a cross-section of a YAG 1 comprising an electron beamlet receiving surface provided with an electron blocking structure. The electron blocking structure comprises electron blocking regions provided with a layer 18 capable of blocking electrons. The blocking layer 18 may be a metal layer. A suitable metal for blocking electrons is tungsten. In between the blocking regions are non-blocking regions. An electron beam 22 impinging onto a non-blocking region of the electron blocking structure actually impinges onto the surface of the YAG 1 or a coating on the surface of the YAG.

Within the portions for blocking electrons, besides the blocking layer 18 an additional layer 21 may be present. The additional layer 21 may be a metal layer, and may serve the purpose of increasing the edge sharpness of the blocking layer 18. This is achieved by choosing an additional layer material that is resistant to the blocking layer etching process. When tungsten is chosen as the blocking layer material, a suitable material for the additional layer 21 is chrome.

The YAG 1 may be coated with a conducting coating layer 20. The purpose of this coating is to prevent charging of the YAG 1 as a result of the incoming charged particle beamlets. The coating could also be used for blocking background radiation. Suitable materials for the coating layer 20 include aluminum and titanium.

As mentioned earlier, in order to determine the position of an electron beam 22, the electron beam 22 may be scanned over a blocking structure provided on the YAG 1 (in FIG. 2a in a direction denoted as X-direction). In response, light generated within the YAG 1 may be detected by a camera. An exemplary result of such scanning and detection action is schematically depicted in FIG. 2b.

Figure 2B:
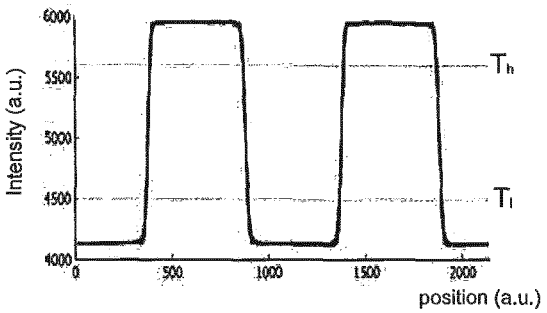

FIG. 2b shows a graph representing intensity of light emitted by a conversion element 1 as a function of x-position of an electron beam 22 over the surface of the conversion element 1. A maximum response is observed when electron beam 22 is entirely positioned in a non-blocking region, and minimal light is generated if the electron beam 22 is positioned entirely on top of a blocking region. The crossing of a knife edge results in a steep change of light intensity.

Upon scanning an electron beam in a predetermined direction, the electron beamlet may encounter two types of situations while crossing a knife edge. In a first situation, the beamlet experiences a transition from a blocking region to a non-blocking region. In a second situation, the beamlet experiences a transition from a non-blocking region to a blocking region.

Knife edges being encountered during a transition that corresponds to the first situation may be referred to as knife edges of a first type. Similarly, knife edges being encountered during a transition that corresponds to the second situation may be referred to as knife edges of a second type. The type of knife edge is thus dependent on the scanning direction of the beamlet to be measured. If reference is made to "knife edges of similar type", this means that all the knife edges involved either relate to knife edges of the first type or relate to knife edges of the second type.

Knowledge of the knife edge pattern provided on the electron-receiving surface of the conversion element surface allows for the determination of a beam position. The beamlet position can be measured by scanning the beamlet across the surface of the conversion element in the x-direction and measuring the position at which the intensity of light emitted by a conversion element changes from a maximum to a minimum value or from a minimum to a maximum value, as shown in FIG. 2b. For example, when the intensity changes from maximum to minimum value, this indicates that the beamlet is scanned over a knife edge transitioning from a non-blocking region to a blocking region in the x direction. However, there may be uncertainty as to which knife edge the beamlet is located at.

Note that the measurement shown in FIG. 2b, and the discussion of beamlet position measurements generally relates to a beamlet having dimensions that are smaller than the widths of the blocking and non-blocking regions involved. These dimensions and widths are taken along a direction parallel to the scan direction being used.

Figure 3A:
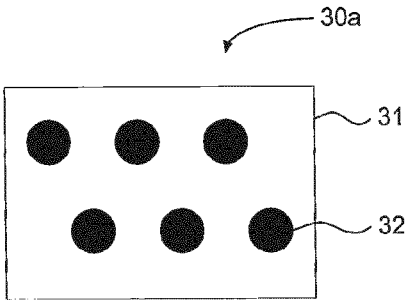
FIGS. 3a and 3b schematically show a top view of two different two-dimensional blocking patterns.
Figure 3B:
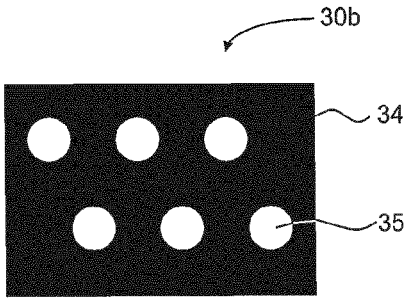

FIGS. 3a and 3b schematically show a top view of two different two-dimensional blocking patterns that may be used in some embodiments of the invention. Both two-dimensional blocking patterns comprise a plurality of substantially circular features. In FIG. 3a, the circular features are blocking features on top of a transmissive surface, whereas the two-dimensional blocking pattern of FIG. 3b is formed by a non-blocking layer provided with a plurality of substantially circular apertures. Preferably, the pitch between the circular features corresponds to the pitch of the beamlets being provided in the multi-beamlet exposure apparatus as will be discussed with reference to FIGS. [10 and 11] *6 and 7*.

Figure 4:
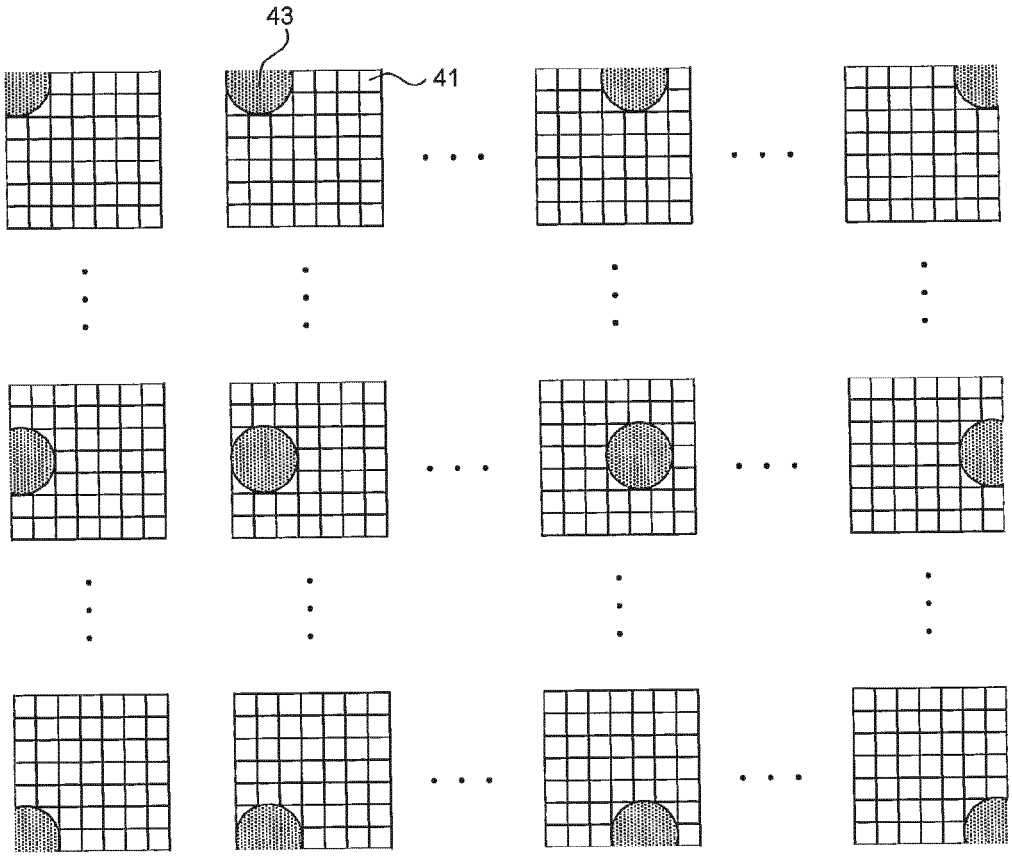
FIG. 4 schematically shows a representation of a plurality of measurement arrangements.

FIG. 4 schematically shows a representation of a plurality of measurement arrangements, each measurement arrangement representing a measurement that is taken on a selected portion of a two-dimensional blocking pattern, for example a blocking pattern as shown in FIG. 3a or 3b. In each measurement a feature 43 is exposed with a charged particle beamlet. Exposing a feature means that by means of the charged particle beamlet a two-dimensional pattern is formed, for example by turning the beamlet on/off or by blocking or letting the beamlet through while executing a two-dimensional scan with the beamlet. The position at which the feature is exposed differs for each measurement. The positions of the feature in the different measurement arrangements form a two-dimensional grid, in FIG. 4 schematically taking the form of a two-dimensional grid with grid cells 41. In each arrangement, the exposed feature 43 is centered in a different grid cell 41. The exemplary two-dimensional grid shown in FIG. 4 contains 7×7=49 grid cells 41.

For example, the most upper left arrangement depicts the feature 43 being exposed with its center in the grid cell 41 formed by the first row and the first column in the two-dimensional (7×7) grid. Similarly, the most bottom right arrangement depicts the feature 43 being exposed with its center in the grid cell 41 formed by the last row and the last column in the two-dimensional (7×7) grid. For simplicity, not all possible 49 arrangements are shown, but merely the arrangements in which the exposed feature positions correspond to grid cells 41 that are formed by the first, fourth or seventh row and the first, second, fifth or seventh column in the two-dimensional (7×7) grid.

The two-dimensional grid is projected over a portion of a two-dimensional pattern of beamlet blocking and non-blocking regions provided on a sensor surface area. The sensor comprises a conversion element for converting the energy of charged particles into light. Light generated by the conversion element is received in response to charged particles being transmitted through non-blocking regions within the two-dimensional pattern. The received light may be converted into a light intensity value using a light sensitive detector, such as a CCD-camera.

In each measurement, a light intensity value is derived by conversion of the received light. The light intensity value is then assigned to the grid cell 41 onto which the exposed feature was centered. Consequently, in this example 7×7=49 light intensity values may be obtained.

Taking measurements at different positions, for example to create the arrangements shown in FIG. 4, may be achieved in different ways. One approach would be to move the two-dimensional pattern between measurements. For example, in FIG. 4, starting from the top left measurement arrangement of FIG. 4 (row 1, column 1), the two-dimensional pattern may be moved by a distance corresponding to the width of a single grid cell 41 to arrive at the measurement arrangement adjacent to the top left measurement arrangement, i.e. the measurement arrangement with a beamlet projection centered in the grid cell 41 formed by the first row and the second column of the two-dimensional grid.

Another way of taking measurements at different positions is by using one or more electrostatic deflectors. By suitably deflecting the beamlet between measurements such that the beamlet is centered onto the desired grid cell for the next measurement to be taken, the two-dimensional image may be created.

Yet another way of taking measurement is making use of the writing scheme of the exposure apparatus. Typically, a writing scheme includes the movement of beamlets over a surface along a predetermined path. By modulating the beamlet (on or off) a pattern is written on the surface. Beamlet movement may include mechanical movement of the beam with respect to the target surface and/or deflection movement by one or more electrostatic deflectors. By scanning a beamlet along a two-dimensional path over the two-dimensional pattern, while allowing the beamlet to expose the two-dimensional pattern during a portion of the scan path a measurement may be taken. If such scanning is repeatably executed, while the scan path portion at which the two-dimensional pattern is exposed differs for each measurement, a sequence of measurement arrangements as shown in FIG. 4 is formed, and a two-dimensional image of intensity values as a function of grid position may be created.

Figure 5:
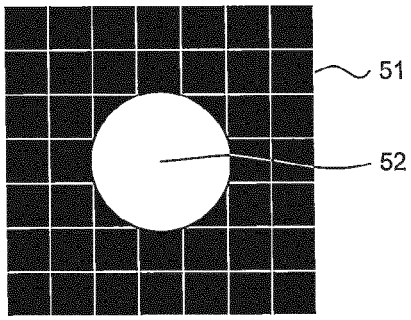
FIG. 5 schematically shows an example of a two-dimensional pattern that may be used in embodiments of the invention.

FIG. 5 schematically shows an example of a two-dimensional pattern over which a two-dimensional grid may be projected. In this particular example, the two-dimensional pattern is formed by a blocking layer 51 comprising a non-blocking circular region 52, further referred to as aperture 52. With such two-dimensional pattern, the light intensity received by the light sensitive detector reaches a maximum intensity value at the measurement position for which the aperture 52 and the charged particle beamlet 43 are mutually aligned. If the two-dimensional pattern of FIG. 5 is used in a plurality of measurements as depicted in and described with reference to FIG. 4, and the position of the beamlet is completely as expected, a maximum intensity value is obtained with the projected beamlet 43 at a position corresponding to the grid cell 41 formed by the fourth row and the fourth column in the two-dimensional grid. After all, this grid cell would fall entirely on top of the aperture 52. However, if the beamlet is at a slightly different position, the maximum intensity may be obtained with the projected beamlet 43 being at a different position.

Preferably, the apertures 52 are of the same size as the expected projection size of the beamlet 43 during exposure on the sensor surface. Such similar size increases the sensitivity of the measurement, because a small deviation from the perfect mutual alignment position already causes a distinguishable decrease of the detected light intensity value.

The plurality of measurements being taken on the two-dimensional pattern enables the creation of a two-dimensional image, showing light intensity as a function of grid position. A fitting algorithm may now be applied to the resulting two-dimensional image to obtain the actual position of the beamlet 43 with respect to the aperture 52 with sub-grid cell accuracy. Such fitting algorithm may include fitting of a two-dimensional (2D) Gauss onto the two-dimensional image. The inventors have realized that the convolution of a substantially circular aperture with the substantially circular beamlet projection on the sensor surface as a function of the extent of their mutual alignment closely resembles a 2D Gauss.

Embodiments of the invention have been described with reference to a single beamlet 43 and a two-dimensional pattern with a single feature, i.e. aperture 52. However, some embodiments of the invention may also be used to determine the beamlet position of a plurality of beamlets. In such case, the two-dimensional pattern may include a plurality of features such as apertures, each beamlet being measured with respect to a different feature.

Figure 6:
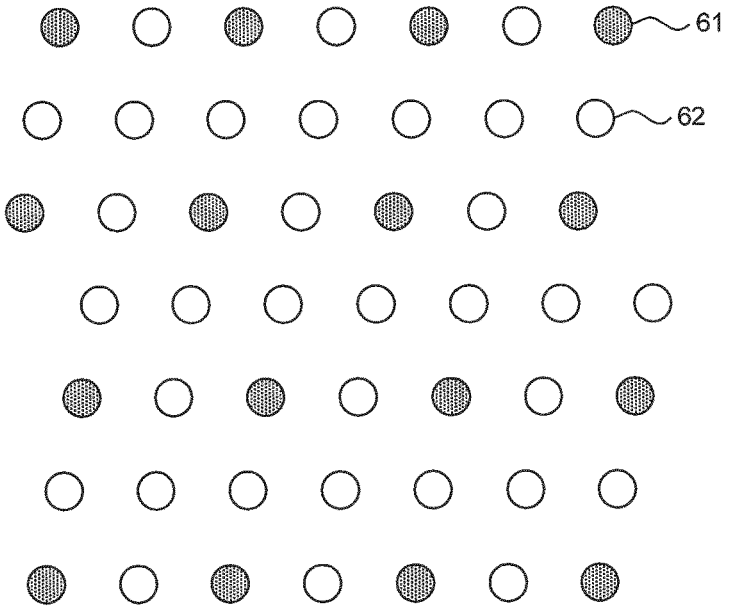
FIG. 6 schematically shows an arrangement of a plurality of beamlets.
Figure 7:
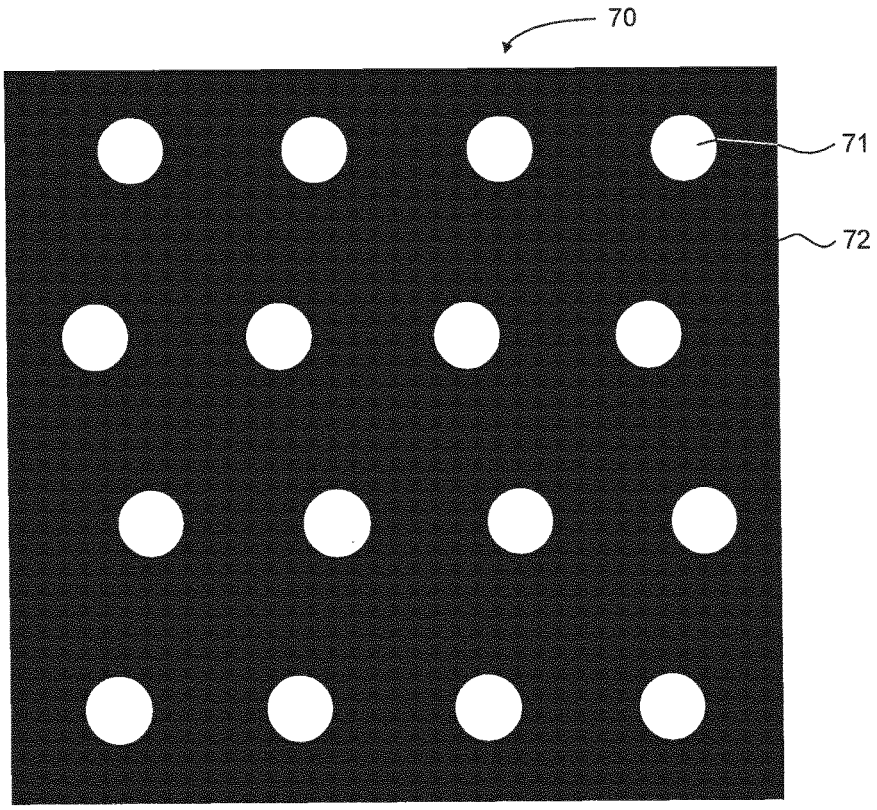
FIG. 7 schematically shows a two-dimensional pattern comprising a charged particle blocking layer provided with a plurality of apertures.

FIG. 6 schematically shows an arrangement of a plurality of beamlets 61, 62. FIG. 7 schematically shows a two-dimensional pattern 70 of a plurality of apertures 71 in a charged particle blocking layer 72. The positions of beamlets 61, schematically denoted by the dotted surface, are determined by performing measurements as discussed with reference to FIG. 4 in relation to two-dimensional grids projected over the apertures 71 in the two-dimensional pattern 70 of FIG. 7.

Although FIG. 6 indicates that only selected beamlets 61 are subject to the measurement method, it is also possible to use all beamlets 61, 62, thus including the currently non-selected beamlets 62. However, using a selection of beamlets 61 in the measurement method has the advantage that less processing power is needed to determine the position of each selected beamlet. Furthermore, in particular if the pitch P between the beamlets is very small, e.g. below 50 nm, manufacturing a sufficiently accurate two-dimensional pattern is relatively complex and costly. The expression "pitch" is to be understood to mean the nominal distance between two adjacent beamlets in a predetermined direction, generally a direction substantially perpendicular to the mechanical scan direction of the multi-beamlet exposure apparatus. Reducing the manufacturing requirements of the two-dimensional pattern may be achieved by selecting every other beamlet 61 for participation in the measurement. The positions of the other beamlets 62 may then be estimated, for example by using interpolation techniques applied to the measured positions of the neighboring selected beamlets 61.

Furthermore, the parallel measurement of a plurality of beamlets 61 may result in the determination of a position of a subbeam of which the beamlets 61 are part. The use of multiple measurements in parallel increases the signal-to-noise ratio of the subbeam position measurement.

Theoretically, beamlets in a multiple beamlet exposure system are spaced apart in accordance with a known design. As a result, the nominal vector distance, for example defined as the x and y coordinates of a hypothetically perfect system, between separate beamlets within the design is known. This knowledge may be used to control stitching. However, due to practical limitations, the actual vector distance between beamlets is not identical to the nominal vector distance. As a result, so-called stitching errors may occur. A stitching error may be defined as the vector deviation between a nominal position and an actual position of a beamlet patterning a surface.

The measurement methods discussed above may further be used to determine an actual vector distance between a first beamlet and a second beamlet in the surface plane of the charged particle receiving surface of the conversion element. Furthermore, a deviation from a nominal vector distance between two beamlets may be derived. Determining the actual vector distance between two beamlets, or, additionally or alternatively, determining a deviation from a nominal vector distance between two beamlets, can be useful for predicting a stitching error resulting from exposing a target surface with a multi-beamlet exposure apparatus using the respective beamlets. If the actual vector distance is known, the control data can be amended by replacement of the nominal vector distance by the measured actual vector distance with respect to these beamlets. If the deviation from the nominal vector distance is known, adequate compensation can be arranged by amending the control data of at least one of the respective beamlets.

Embodiments of the method for determining an actual vector distance between a first beamlet and a second beamlet may include the following. First, a beamlet position of the first beamlet is determined using an embodiment of the abovementioned method for determining a beamlet position in a charged particle multi-beamlet exposure apparatus. Then, the two-dimensional pattern is transferred in a direction substantially parallel to the sensor surface plane over a predetermined vector distance. The predetermined vector distance is defined as a predetermined distance in a predetermined direction in the surface plane of the charged particle receiving surface of the sensor. The predetermined distance generally corresponds to the theoretical distance between the first beamlet and the second beamlet. Similarly, the predetermined direction generally corresponds to the direction at which, starting from the first beamlet, the second beamlet is to be expected.

Typically, transferring the two-dimensional pattern is the easiest way to arrange exposure of the two-dimensional pattern by the first beamlet and the second beamlet. However, it may also be feasible to transfer the second beamlet over a predetermined vector distance, or to allow relative movement between the beamlets and the two-dimensional pattern with respect to each other.

Then, a beamlet position of the second beamlet is determined using an embodiment of the abovementioned method for determining a beamlet position in a charged particle multi-beamlet exposure apparatus. So, a plurality of measurements is taken at different positions, where the measurement positions form a two dimensional grid, each measurement comprising exposing a portion of the two-dimensional pattern with the second beamlet, receiving light generated by the conversion element in response to charged particles being part of the second beamlet transmitted through the non-blocking regions of two-dimensional pattern, and converting the received light into a further light intensity value by means of the light sensitive detector. The position of the second beamlet is then determined with respect to the two-dimensional pattern on the basis of a further two-dimensional image created by means of the further light intensity values at the different positions within the two-dimensional grid.

Finally, the actual distance between the first beamlet and the second beamlet is determined on the basis of the determined beamlet position of the first beamlet, the determined beamlet position of the second beamlet and the predetermined vector distance.

Again, in addition to the determination of an actual distance between two beamlets, such determination may be performed for multiple beamlet pairs within a plurality of beamlets in parallel. Such parallel measurement would improve the signal-to-noise ratio of the measurements being performed.

Figure 8:
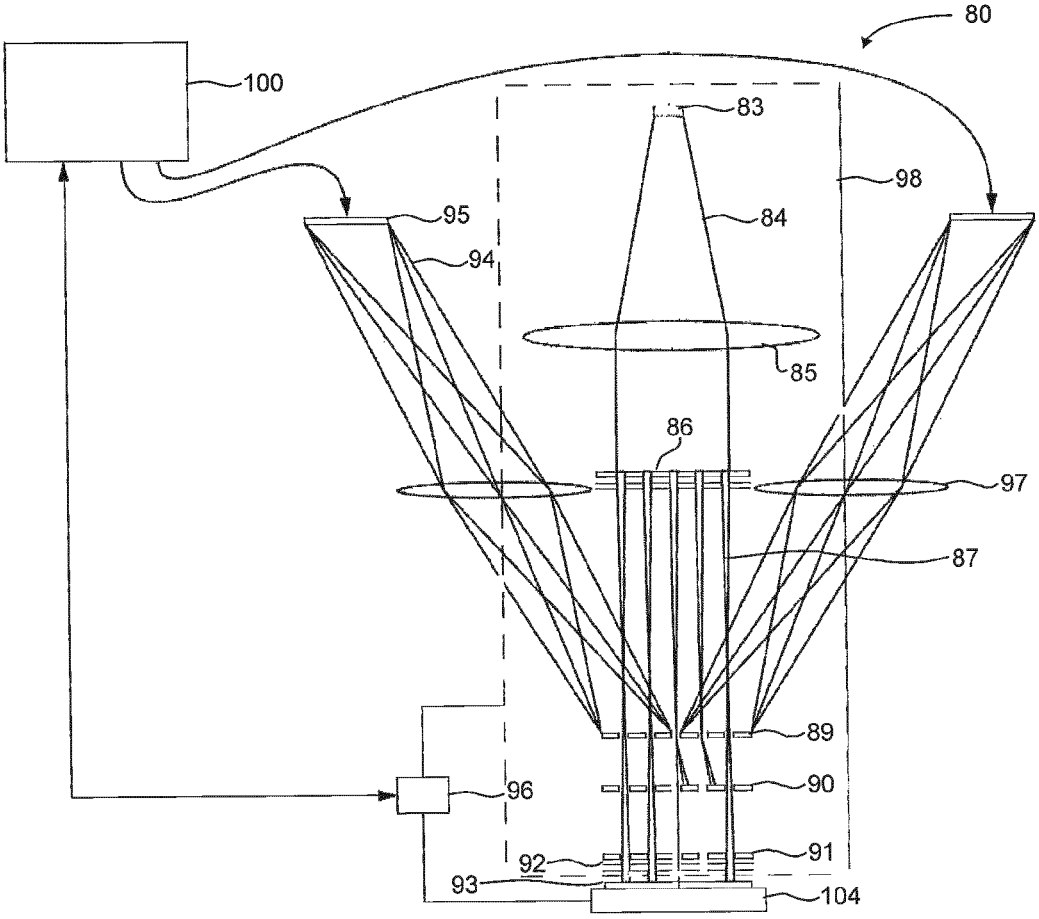
FIG. 8 schematically shows a charged particle multi-beamlet lithography system that may be used in embodiments of the invention.

FIG. 8 shows a simplified schematic drawing of an embodiment of a charged particle multi-beamlet lithography system 80. The lithography system 80 suitably comprises a beamlet generator generating a plurality of beamlets, a beamlet modulator patterning the beamlets to form modulated beamlets, and a beamlet projector for projecting the modulated beamlets onto a surface of a target.

The beamlet generator typically comprises a source and at least one beam splitter. The source in FIG. 8 is a charged particle source 83 arranged to produce a substantially homogeneous, expanding charged particle beam 84. Hereafter, the operation of the lithography system will be discussed with reference to an electron source 83 arranged for generating an electron beam 84.

In FIG. 8 the electron beam 84 from the electron source 83 passes a collimator lens 85 for collimating the electron beam 84. The collimator lens 85 may be any type of collimating optical system. Subsequently, the electron beam 84 impinges on a beam splitter, in the embodiment of FIG. 8 an aperture array 86. The aperture array 86 preferably comprises a plate having through-holes. The aperture array 86 is arranged to block part of the beam 84. Additionally, the array 86 allows a plurality of beamlets 87 to pass through so as to produce a plurality of parallel electron beamlets 87.

The lithography system 80 of FIG. 8 generates a large number of beamlets 87, preferably about 10,000 to 1,000,000 beamlets, although it is of course possible that more or less beamlets are generated. A second aperture array may be added in the system, so as to create subbeams from the electron beam 84 and to create electron beamlets 87 from the subbeam. This allows for manipulation of the subbeams further downstream, which turns out beneficial for the system operation, particularly when the number of beamlets in the system is 5,000 or more.

The beamlet modulator typically comprises a beamlet blanker array 89 comprising an arrangement of a plurality of blankers. Typically, the beamlet blanker array 89 cooperates with a beamlet stop array 90. The blankers are capable of deflecting one or more of the electron beamlets 87. In embodiments of the invention, the blankers are more specifically electrostatic deflectors provided with a first electrode, a second electrode and an aperture. The electrodes are then located on opposing sides of the aperture for generating an electric field across the aperture. Generally, the second electrode is a ground electrode, i.e. an electrode connected to ground potential. To focus the electron beamlets 87 within the plane of the blanker array 89 the lithography system may further comprise a condenser lens array.

In the embodiment of FIG. 8, the beamlet stop array 90 comprises an array of apertures for allowing beamlets to pass through. The beamlet stop array 90, in its basic form, comprises a substrate provided with through-holes, typically round holes although other shapes may also be used. The beamlet blanker array 89 and the beamlet stop array 90 operate together to block or let pass the beamlets 87. In some embodiments, the apertures of the beamlet stop array 90 are aligned with the apertures of the electrostatic deflectors in the beamlet blanker array 89. If beamlet blanker array 89 deflects a beamlet, it will not pass through the corresponding aperture in the beamlet stop array 90. Instead the beamlet will be blocked by the substrate of beamlet block array 90. If beamlet blanker array 89 does not deflect a beamlet, the beamlet will pass through the corresponding aperture in the beamlet stop array 90. In some alternative embodiments, cooperation between the beamlet blanker array 89 and the beamlet stop array 90 is such that deflection of a beamlet by a deflector in the blanker array 89 results in passage of the beamlet through the corresponding aperture in the beamlet stop array 90, while non-deflection results in blockage by the substrate of the beamlet stop array 90.

The beamlet modulator is arranged to add a pattern to the beamlets 87 on the basis of input provided by a control unit 100. The control unit 100 may be located remote from the rest of the system, for instance outside the inner part of a clean room. The control system 100 may further be connected to an actuator system 96. The actuator system is arranged for executing a relative movement of the electron-optical column, i.e. the components of the lithography system 80 for generating and projecting the beamlets represented by the dashed line 98 in FIG. 8, and a target positioning system 104.

Modulated light beams 94 holding pattern data are transmitted to the beamlet blanker array 89 using optical fibers. More particularly, the modulated light beams 94 from optical fiber ends part of an optical fiber array 95 are projected, e.g. by using one or more lenses 97, on corresponding light sensitive elements located on the beamlet blanker array 89. The light sensitive elements may be arranged to convert the light signal into a different type of signal, for example an electric signal. A modulated light beam 94 carries a portion of the pattern data for controlling one or more blankers that are coupled to a corresponding light sensitive element. In some embodiments, the light beams 94 may, at least partially, be transferred towards the light sensitive elements by means of an optical waveguide.

The modulated beamlets coming out of the beamlet modulator are projected as a spot onto a target surface of a target 93 by the beamlet projector. The beamlet projector typically comprises a scanning deflector for scanning the modulated beamlets over the target surface and a projection lens system for focusing the modulated beamlets onto the target surface. These compounds may be present within a single end module.

Such end module is preferably constructed as an insertable, replaceable unit. The end module may thus comprise a deflector array 91, and a projection lens arrangement 92. The insertable, replaceable unit may also include the beamlet stop array 90 as discussed above. After leaving the end module, the beamlets 87 impinge on a target surface positioned at a target plane. For lithography applications, the target 93 usually comprises a wafer provided with a charged-particle sensitive layer or resist layer.

The deflector array 91 may take the form of a scanning deflector array arranged to deflect each beamlet 87 that passed the beamlet stop array 90. The deflector array 91 may comprise a plurality of electrostatic deflectors enabling the application of relatively small driving voltages. Although the deflector array 91 is drawn upstream of the projection lens arrangement 92, the deflector array 91 may also be positioned between the projection lens arrangement 92 and the target surface.

The projection lens arrangement 92 is arranged to focus the beamlets 87, before or after deflection by the deflector array 91. Preferably, the focusing results a geometric spot size of about 10 to 30 nanometers in diameter. In such preferred embodiment, the projection lens arrangement 92 is preferably arranged to provide a demagnification of about 100 to 500 times, most preferably as large as possible, e.g. in the range 300 to 500 times. In this preferred embodiment, the projection lens arrangement 92 may be advantageously located close to the target surface.

Commonly, the target surface comprises a resist film on top of a substrate. Portions of the resist film will be chemically modified by application of the beamlets of charged particles, i.e. electrons. As a result thereof, the irradiated portion of the film will be more or less soluble in a developer, resulting in a resist pattern on a wafer. The resist pattern on the wafer can subsequently be transferred to an underlying layer, i.e. by implementation, etching and/or deposition steps as known in the art of semiconductor manufacturing.

In the system shown in FIG. 8, the taking of measurements at different positions for determining a beamlet position may be achieved by using one or more different techniques.

A first possibility is to move the two-dimensional pattern in between measurements. In FIG. 8, the two-dimensional pattern may be provided on the target positioning system 104. By moving the target positioning system 104 using the actuator system 96 under control of control system 100 the two-dimensional pattern can be displaced in an accurate way.

A second option, which may be combined with the abovementioned displacement of the two-dimensional pattern, is the use of one or more electrostatic deflectors. Taking measurements at different positions may then be achieved by suitably deflecting the beamlet which position is to be determined in between measurements. Such electrostatic deflectors may already be present in the charged particle multi-beamlet exposure apparatus for other purposes, e.g. the one or more deflectors may be part of the deflector array 91 in the system 80 of FIG. 8. Alternatively, the one or more electrostatic deflectors are provided for the purpose of determining a beamlet position in the exposure apparatus.

Yet another way to take the measurements at different positions for determining the beamlet position is to scan the beamlet along a two-dimensional path over the two dimensional pattern while allowing the beamlet to expose the two-dimensional pattern during a portion of the scan path. In order to form different portions in the two-dimensional grid, for each measurement the scan path portion at which the two-dimensional pattern is exposed differs.

The invention has been described by reference to certain embodiments discussed above. It will be recognized that these embodiments are susceptible to various modifications and alternative forms well known to those of skill in the art. Further modifications in addition to those described above may be made to the structures and techniques described herein without departing from the spirit and scope of the invention. Accordingly, although specific embodiments have been described, these are examples only and are not limiting upon the scope of the invention, which is defined in the accompanying claims.

The invention claimed is:

1. A method for determining a beamlet position of a charged particle beamlet in a charged particle multi-beamlet exposure apparatus provided with a sensor comprising a conversion element for converting the energy of charged particles into light and a light sensitive detector, the conversion element being provided with a sensor surface area provided with a two-dimensional pattern of beamlet blocking and non-blocking regions, the method comprising:

taking a plurality of measurements using said charged particle beamlet, wherein said charged particle beamlet is turned off or blocked from reaching the two-dimensional pattern in between each of said plurality of measurements, wherein each measurement comprises:

writing two-dimensional feature at a position onto a portion of the two-dimensional pattern with said charged particle beamlet, wherein said two-dimensional feature is written by scanning the charged particle beamlet along a two-dimensional path over the two-dimensional pattern while allowing the charged particle beamlet to expose the two-dimensional pattern during a portion of the two-dimensional path wherein the position at which the feature is exposed differs for each measurement, the positions forming a two-dimensional grid;

receiving light generated by the conversion element in response to charged particles, being part of said charged particle beam writing the two-dimensional feature, being transmitted through the non-blocking regions of the two-dimensional pattern; and converting the received light into a light intensity value by means of the light sensitive detector, and assigning the light intensity value to the position at which the measurement was taken;

wherein the position at which the two-dimensional feature is written onto the portion of the two-dimensional pattern differs for each measurement, resulting in a plurality of two-dimensional features being written onto the two-dimensional pattern, the positions at which the two-dimensional features are written forming a two-dimensional grid;

determining the position of said charged particle beamlet with respect to the two-dimensional pattern on the basis of a two-dimensional image created by means of the light intensity values at the different positions within the two-dimensional grid, the two-dimensional image showing light intensity as a function of grid position.

2. The method of claim 1, wherein the two-dimensional pattern of beamlet blocking and non-blocking regions takes the form of a blocking surface provided with non-blocking holes.

3. The method of claim 2, wherein the holes have a substantially circular shape.

4. The method of claim 3, wherein the holes are of the same size as the size of the exposed feature.

5. The method of claim 1, wherein the two-dimensional pattern of beamlet blocking and non-blocking regions takes the form of a non-blocking surface provided with blocking features.

6. The method of claim 5, wherein the blocking features have a substantially circular shape.

7. The method of claim 6, wherein the blocking features are of the same size as the size of the written two-dimensional feature.

8. The method of claim 1, wherein the written two-dimensional feature has a substantially circular shape.

9. The method of claim 1, wherein writing a two-dimensional feature onto a portion of the two-dimensional pattern with a charged particle beamlet comprises scanning the beamlet along a two-dimensional path over the portion of the two-dimensional pattern during which scanning the charged particle beamlet is active during a predetermined portion of the scan path, and wherein differing the position at which the two-dimensional feature is exposed for each measurement comprises changing the predetermined portion of the scan path for each measurement.

10. The method of claim 9, wherein the scanning is performed by electrostatic deflection.

11. The method of claim 1, wherein determining the position of the charged particle beamlet includes fitting a 2D Gaussian.

12. A computer readable medium for performing, when executed by a processor, the method for determining a beamlet position in a charged particle multi-beamlet exposure apparatus according to claim 1.

13. A method for determining a distance between two beamlets in a charged particle multi-beamlet exposure apparatus provided with a sensor comprising a conversion element for converting the energy of charged particles into light and a light sensitive detector, the conversion element being provided with a sensor surface area provided with a two-dimensional pattern of beamlet blocking and non-blocking regions, the method comprising:

performing a method for determining a beamlet position of a charged particle beamlet in said charged particle multi-beamlet exposure apparatus, the method for determining a beamlet position comprising:

taking a plurality of measurements using said charged particle beam let, wherein each measurement comprises:

exposing a two-dimensional feature at a position onto a portion of the two-dimensional pattern with said charged particle beamlet wherein the position at which the feature is exposed differs for each measurement, the positions forming a two-dimensional grid;

receiving light generated by the conversion element in response to charged particles, being part of said charged particle beam writing the two-dimensional feature, being transmitted through the non-blocking regions of the two-dimensional pattern; and converting the received light into a light intensity value by means of the light sensitive detector, and assigning the light intensity value to the position at which the measurement was taken;

determining the position of said charged particle beamlet with respect to the two-dimensional pattern on the basis of a two-dimensional image created by means of the light intensity values at the different positions within the two-dimensional grid;

transferring the two-dimensional pattern in a direction substantially parallel to the sensor surface plane over a predetermined distance;

taking a plurality of said measurements for determining a beamlet position of a charged particle beamlet in said charged particle multi-beamlet exposure apparatus, wherein each measurement comprises:

exposing a two-dimensional feature onto a portion of the two-dimensional pattern with a further charged particle beamlet, the further charged particle beamlet having a theoretical distance from said charged particle beamlet equal to the predetermined distance over which the two-dimensional pattern has been transferred, wherein the position at which the feature is exposed differs for each measurement, the positions forming a two-dimensional grid;

receiving light generated by the conversion element in response to charged particles, being part of said charged particle beam writing the two-dimensional feature, being transmitted through the non-blocking regions of two-dimensional pattern; and converting the received light into a further light intensity value by means of the light sensitive detector, and assigning the further light intensity value to the position at which the measurement was taken;

determining the position of the further charged particle beamlet with respect to the two-dimensional pattern on the basis of a two-dimensional image created by means of the further light intensity values at the different positions within the two-dimensional grid;

determining the actual distance between the charged particle beamlet and the further beamlet based on the determined charged particle beamlet position, the determined further charged particle beamlet position and the predetermined distance.

14. The method of any claim 13, wherein exposing a feature onto a portion of the two-dimensional pattern with the further charged particle beamlet comprises scanning the beamlet along a two-dimensional path over the portion of the two-dimensional pattern during which the further charged particle beamlet is active during a predetermined portion of the scan path, and wherein differing the position at which the feature is exposed for each measurement comprises changing the predetermined portion of the scan path for each measurement.

15. The method of claim 14, wherein the scanning is performed by electrostatic deflection.

16. The method of claim 14 or 15, wherein determining the position of the further charged particle beamlet includes fitting a 2D Gaussian.

17. Computer readable medium for performing, when executed by a processor, the method for determining an actual distance between two beamlets in a charged particle multi-beamlet exposure apparatus according to claim 13.

*18. A method for determining a beamlet position of a charged particle beamlet in a charged particle multi-beamlet exposure apparatus provided with a sensor comprising a detector and a sensor surface area provided with a two-dimensional pattern of beamlet blocking and non-blocking regions, the method comprising:*

*taking a plurality of measurements corresponding to different positions to form a two-dimensional grid, wherein each measurement comprises:*

*exposing a two-dimensional feature at a position onto the two-dimensional pattern with a charged particle beamlet, wherein the position at which the two-dimensional feature is exposed differs for each measurement;*

*receiving charged particles, being part of the charged particle beamlet exposing the two-dimensional feature, being transmitted through the non-blocking regions of the two-dimensional pattern; and*

*converting received charged particles into an intensity value using the detector, wherein the intensity value is assigned to the position at which the measurement was taken; and*

*determining a location of the charged particle beamlet with respect to the two-dimensional pattern on the basis of a two-dimensional image created using intensity values at the different positions within the two-dimensional grid.*

*19. The method of claim 18, further comprising:*

*transferring the two-dimensional pattern by a predetermined vector distance corresponding to a nominal distance between the charged particle beamlet and another charged particle beamlet in the charged particle multi-beamlet exposure apparatus;*

*determining a location of the another charged particle beamlet; and*

*determining a distance between the charged particle beamlet and the another charged particle beamlet based on the predetermined vector distance and the determined locations of the charged particle beamlet and the another charged particle beamlet.*

*20. The method of claim 19, wherein the nominal distance corresponds to a pitch between two neighboring beamlet blocking regions or two neighboring beamlet non-blocking regions among the beamlet blocking and non-blocking regions.*

* * * * *